United States Patent

North et al.

[15] 3,700,978

[45] Oct. 24, 1972

[54] FIELD EFFECT TRANSISTORS AND METHODS FOR MAKING FIELD EFFECT TRANSISTORS

[72] Inventors: James Clayton North; Bernard Roger Pruniaux, both of New Providence, N.J.

[73] Assignee: Bell Telephone Laboratories, Murray Hill, N.J.

[22] Filed: March 18, 1971

[21] Appl. No.: 125,528

[52] U.S. Cl. .............317/235 R, 317/235 B, 29/571, 148/1.5

[51] Int. Cl. .............H01l 11/14

[58] Field of Search..317/234, 234 T, 234 UA, 235B, 317/235 AL, 48.9; 29/571, 584–586; 148/1.5

[56] References Cited

UNITED STATES PATENTS

| | | | |
|---|---|---|---|
| 3,484,662 | 12/1969 | Hagon | 317/235 |
| 3,483,443 | 12/1969 | Mayer et al. | 317/235 |
| 3,596,347 | 8/1971 | Beale et al. | 317/235 |

FOREIGN PATENTS OR APPLICATIONS

| | | | |
|---|---|---|---|
| 1,140,579 | 1/1969 | Great Britain | 317/235 |

OTHER PUBLICATIONS

Solid State Electronics, " Isolation of Junction Devices in GaAs using Proton Bombardment" by Foyt et al., 4/69, pages 209-214

*Primary Examiner*—Jerry D. Craig
*Attorney*—R. J. Guenter and Arthur J. Torsiglieri

[57] ABSTRACT

The insulative gate layer of an insulated gate field effect transistor (IGFET) is made by exposing a channel region of a semiconductor wafer to high energy proton bombardment. The bombardment damages the crystal structure of the semiconductor to a predetermined depth to make that part of the semiconductor nonconductive.

2 Claims, 2 Drawing Figures

INVENTORS J. C. NORTH
B. R. PRUNIAUX
BY
Robert B Anderson
ATTORNEY

FIELD EFFECT TRANSISTORS AND METHODS FOR MAKING FIELD EFFECT TRANSISTORS

BACKGROUND OF THE INVENTION

This invention relates to field effect transistors, and more particularly, to methods for producing the insulative film required for the gate of an insulated gate field effect transistor (IGFET).

An insulated gate field effect transistor (IGFET) is a semiconductor device comprising a gate electrode insulated from a semiconductor wafer and located between source and drain contacts to the wafer. A conducting channel is defined in the wafer opposite the gate electrode between the source and drain contacts. Voltages on the gate electrode control current in the conducting channel, thereby to perform such useful operations as amplification and switching.

While most field effect transistors use a silicon semiconductor, it has long been recognized that, for many purposes, gallium-arsenide is superior; see for example the paper "Gallium-Arsenide FET's Outperform Conventional Silicon MOS Devices," by H. Becke and J. White, *Electronics*, pages 82–90, June 12, 1967. However, it is difficult to make reliable and reproducible insulative films on gallium-arsenide. Thus, most such GaAs devices have used Schottky barrier gates, rather than insulated gates; that is, the gate electrode directly contacts the gallium-arsenide wafer with which it forms a Schottky barrier junction. As is known, this device can work only in the "depletion mode," which limits its flexibility. Further, unavoidable leakage across a Schottky barrier inherently limits the semiconductor carrier concentration in the channel, and therefore the obtainable device transconductance.

For these and other reasons we have determined that it would be desirable to be able to fabricate dependable and reproducible gallium-arsenide IGFET devices, and particularly, IGFET devices that operate in the "accumulation mode." In such devices, the channel is formed structurally between the gate insulator and an insulative substrate, typically by epitaxially growing a GaAs semiconductive film on a semi-insulative substrate. If the device is to be operated at high frequencies, however, it is difficult to grow the semiconductive layer to a thickness as small as would be desired.

As mentioned before, it is difficult to apply an insulative layer to gallium-arsenide, and even if one is successfully applied, troublesome surface states are inherently formed at the interface of the semiconductor with the insulator. As is known, "surface states" refers to energy states in the band structure at the surface of a semiconductor resulting from the discontinuity in the atomic lattice structure. In gallium-arsenide these energy states are essentially unpredictable and substantially affect the conductivity and other parameters of the device. For example, different d-c gate bias voltages are required for different surface state densities of various devices. In addition, gallium-arsenide is notoriously susceptible to the effects of spurious impurity particles that may be accidentally lodged at the semiconductor-insulator interface. For these and other reasons, attempts at making good gallium-arsenide IGFETs have been largely unsuccessful.

SUMMARY OF THE INVENTION

In accordance with the invention, a gallium-arsenide IGFET device is made by first forming source and drain contacts on an upper surface of a gallium-arsenide wafer. The wafer region between the electrodes is then irradiated with high energy protons. The source and drain contacts, which may be made of gold, are convenient masks for limiting the bombardment to the wafer region between them. The proton bombardment so damages the crystal structure of the wafer as to increase its resistivity to that of an insulator or a semi-insulator, the depth of which is readily controllable by the energy used for the incident protons. A gate electrode is then formed on the upper surface of the newly-formed insulating layer, thereby giving a gallium-arsenide IGFET structure.

The present invention plainly avoids the many fabrication problems otherwise associated with forming an insulative layer on a surface of gallium-arsenide. In addition, it makes possible IGFET devices of superior electrical characteristics. For example, it can be shown that proton bombardment yields a low and predictable number of energy states within the insulating layer; thus device parameters are not dependent on wafer cleaning operations or unique surface characteristics. A channel of very thin dimensions can be made by epitaxially growing the active gallium-arsenide on an insulative substrate, and then controlling the channel thickness by controlling proton bombardment so that it penetrates to a specified depth. In this way the channel thickness may be made to be much smaller than the thickness of the thinnest epitaxial layer that could be grown, thus permitting thinner channel dimensions than would otherwise be possible. This in turn makes possible low-power high-frequency operation in the accumulation mode. Finally, the limitations of the Schottky barrier devices, such as operation with gate bias of only one polarity and a limited carrier concentration and transconductance, are avoided.

These and other objects, features and advantages of the invention will be better understood from a consideration of the following detailed description taken in conjunction with the accompanying drawing.

DRAWING DESCRIPTION

FIG. 1 is a schematic sectional view of an IGFET device made in accordance with an illustrative embodiment of the invention; and FIG. 2. is a view similar to FIG. 1 illustrating one step in the fabrication of an IGFET device.

DETAILED DESCRIPTION

Figure 1:
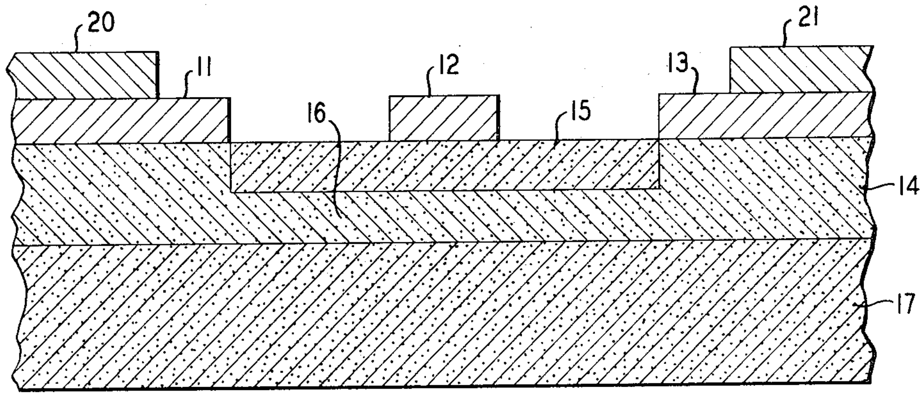

Referring now to FIG. 1 there is shown a sectional view of a field effect transistor, made in accordance with an illustrative embodiment of the invention, comprising a source contact 11, a gate contact 12 and a drain contact 13. The source and drain contacts are ohmic contacts located on the surface of a semiconductor layer 14, while the gate electrode 12 is located on the surface of a substantially insulative layer 15. That part of semiconductor layer 14 extending between the source and drain electrodes, and beneath the gate electrode 12, constitutes a transistor channel 16. A major part of the channel 16 is defined between insulative layer 15 and an insulative substrate 17.

In operation, current flows from source contact 11 to drain contact 13 through the channel 16 and is modulated or controlled by voltages applied to gate electrode 12. This modulation or control mechanism may of course be used for such useful purposes as amplification or switching. The device is preferably operated in the accumulation mode, in which, as is known, the thickness of channel 16 is important and is equal to the distance between substrate 17 and layer 15. Generally speaking, at least for high frequency purposes where high channel conductivity is desirable, it should be very thin to avoid unnecessary power losses.

Figure 2:
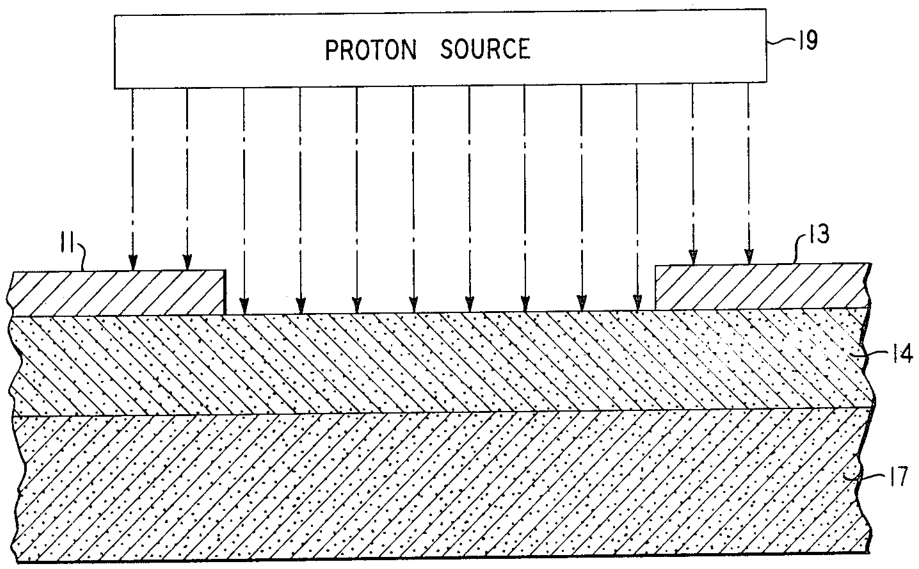

The method by which the structure of FIG. 1 is made will be considered with reference to FIG. 2 in which substrate 17 is a wafer of crystalline semi-insulating gallium-arsenide upon which active semiconductor layer 14 has been epitaxially grown. As is known, epitaxial growth refers to a technique in which a semiconductor layer is formed such that it effectively constitutes an extension of the crystal lattice structure of the substrate. After the epitaxial growth of semiconductor layer 14, source contact 11 and drain contact 13 are formed, as by vapor deposition. These contacts are made, in a known manner, such as to constitute ohmic, rather than rectifying, contacts to the wafer.

The insulative layer 15 is next made by irradiating that part of epitaxial layer 14 between the source and drain contact regions with high energy protons from a proton source 19. As is known, radiation of gallium-arsenide by protons drastically increases the resistivity of the gallium-arsenide because of the disruption and damage of the semiconductor crystal lattice structure by the bombarding particles. It can be shown that the depth to which the protons penetrate the gallium-arsenide and thereby convert it to insulating material is nearly directly proportional to the energy of the proton radiation. The contact regions 11 and 13 are made to be of sufficient thickness that the irradiating protons cannot penetrate through them. Thus, contact regions 11 and 13 act as a mask, and the irradiated region 15 is sharply defined.

Referring again to FIG. 1, after the insulative gate layer 15 has been formed by proton bombardment, the gate electrode 12 is formed along with source electrode 20 and drain electrode 21, as by depositing and etching. Preferably, the foregoing process defines a large number of IGFET devices on a single wafer, which are thereafter separated by scribing and cleaving. Individual devices are then bonded in a package and gold wires are thermo-compression bonded to the source, gate, and drain electrodes.

The finished device of FIG. 1, of course, has the various advantages described in the summary of the invention. Since the insulative gate layer 15 is formed within the semiconductor epitaxial layer 14, the problems of insulative gate layer adherence, spurious surface states, and other semiconductor-insulator interface problems are avoided or at least substantially reduced. This advantage, in fact, is so important that it makes feasible the mass production of dependable and reproducible gallium-arsenide IGFETS, which heretofore has not been possible. In addition, it permits the formation of a much thinner channel 16 than would otherwise be possible. For example, in an experimental model, the epitaxial layer 14 was grown to a thickness of 1.3 microns, which is near the minimum epitaxial layer thickness that can routinely be made. The gate layer 15 was then formed to a thickness of 4.5 microns, leaving a thickness of less than 1 micron for the channel 16. This small channel thickness is, of course, desirable for the reasons given before, and is smaller than that which could ordinarily be made by merely controlling epitaxial layer thickness.

Referring again to FIG. 2, the parameters of the active n-type layer 14 which, in one experimental version, was epitaxially grown on a chromium-doped semi-insulating gallium-arsenide substrate, were as follows: a total epitaxial layer thickness of 1.3 microns, a mobility of 4580 $cm^2/V$ SEC, and grown to an n-type carrier concentration of $8.8 \times 10^{15}$ $cm^{-3}$. The source and drain ohmic contacts 11 and 13 were made by depositing a 4000 A thick gold-germanium film at 300° C and etching by standard photoresist techniques. These contacts were alloyed at 475° C for 20 seconds. The structure was then uniformly bombarded with 25 keV protons at a dose of $10^{14}$ protons/$cm^2$. The penetration depth of 25 keV protons in gold is about 1500 A, and so the layers 11 and 13 constituted effective masks. Electrodes 12, 20, and 21 of FIG. 2 were formed by deposition and etching of pure gold, and 2-mil diameter gold wires were thermo-compression bonded to these electrodes.

The resistivity of the layer 15 was found to be approximately $10^9$ ohm-centimeters which is close to that of intrinsic gallium-arsenide.

A testing of the bombarded layer showed that the current-voltage characteristics across it were nearly symmetrical and linear up to a field of approximately $2 \times 10^4$ V/cm. Leakage current through the gate layer 15 was insignificant up to a forward bias voltage of approximately 3 volts. A transconductance at drain current saturation of approximately 5mA/V was achieved with a gate electrode length of 500 microns (in a direction perpendicular to the channel length), a gate electrode width of 5 microns, and a source-to-drain channel length of 30 microns. The transconductance was maximum and independent of gate bias in the range of −2 to +2 volts. In this voltage range the gate capacitance was practically constant, and the bias on the gate only acted on the charge under the insulative gate layer.

In other experiments, helium ion bombardment was found to be satisfactory for producing the insulative gate layer 15. This indicates that the high resistivity of the layer is due to radiation damage to the crystal structure produced by bombarding particles, rather than to some other mechanism. It is believed that multiple bombardment with beams of different energy levels will produce a flatter profile of crystal damage and thereby a more consistent high resistivity throughout the layer 15.

While the technique described is most promising for use with a high frequency device which requires a narrow channel having a high carrier concentration, and with operation where either a positive or negative gate bias is needed, it could be used for other IGFET modes of operation. While gallium-arsenide is the most promising material to be used in practicing the invention, substantially the same considerations and structural characteristics apply to the other crystalline semiconductors made of III-V compounds, such as indium-phosphide, indium-arsenide-phosphide, and gallim-arsenide,phosphide. Various other embodiments and modifications may be made by those skilled in the art without departing from the spirit and scope of the invention.

What is claimed is:

1. The method for making an insulated gate field effect transistor comprising the steps of growing an epitaxial layer of less than 1.3 microns thickness on a semi-insulative substrate of gallium-arsenide;

forming source and drain contacts on the epitaxial layer;

forming an insulative gate layer comprising the step of irradiating the epitaxial layer surface between the source and drain contacts with protons having sufficient energy to penetrate the epitaxial layer and convert it to insulating material, but having insufficient energy to penetrate through the metal source and drain contacts, whereby the contacts act as a mask to said radiation;

the radiation penetration defining a transistor channel between the insulative gate layer and the semi-insulative substrate having a thickness of less than one micron; and forming a metal gate contact on the insulative gate layer.

2. An insulated gate field effect transistor comprising:

a gallium-arsenide wafer comprising a semi-insulative substrate and an epitaxial upper layer;

displaced source and drain electrodes on the surface of the epitaxial upper layer;

a gate electrode between the source and drain electrodes;

the gate electrode being substantially electrically insulated from the wafer by an insulative gate layer comprising a region of the epitaxial upper layer which has been irradiated with protons of sufficient energy to substantially disrupt and damage the crystal lattice structure of the layer to a predetermined depth;

the epitaxial upper layer having a thickness of less than 1.3 microns; and the semiconductor region between the semi-insulative substrate and the insulative gate layer constituting a transistor channel having a thickness of less than one micron.

* * * * *